(12) United States Patent
Kang et al.

(10) Patent No.: US 12,118,329 B2
(45) Date of Patent: Oct. 15, 2024

(54) DUAL CAPACITOR MIXED SIGNAL MUTIPLIER

(71) Applicant: INTERNATIONAL BUSINESS MACHINES CORPORATION, Armonk, NY (US)

(72) Inventors: Mingu Kang, Old Tappan, NJ (US); Seyoung Kim, White Plains, NY (US); Kyu-Hyoun Kim, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1293 days.

(21) Appl. No.: 16/744,824

(22) Filed: Jan. 16, 2020

(65) Prior Publication Data

US 2021/0224036 A1 Jul. 22, 2021

(51) Int. Cl.
*G06N 3/02* (2006.01)
*G06F 7/523* (2006.01)
*G06N 3/065* (2023.01)
*G11C 27/02* (2006.01)

(52) U.S. Cl.
CPC .............. *G06F 7/523* (2013.01); *G06N 3/065* (2023.01); *G11C 27/026* (2013.01); *G06N 3/02* (2013.01)

(58) Field of Classification Search
CPC . G06F 7/523; G06F 2207/4802; G06N 3/065; G06N 3/02; G06N 3/084; G11C 27/026; G11C 7/1006; G11C 7/16; G11C 11/54; G11C 27/024
See application file for complete search history.

(56) References Cited

U.S. PATENT DOCUMENTS

| | | | |
|---|---|---|---|
| 8,275,727 B2 | 9/2012 | Elmegreen et al. | |
| 9,503,118 B2 | 11/2016 | Zhang et al. | |
| 9,646,243 B1 | 5/2017 | Gokmen | |
| 9,697,877 B2 | 7/2017 | Shanbhag et al. | |
| 9,793,912 B1 | 10/2017 | Ferris et al. | |
| 10,255,205 B1 | 4/2019 | Fick et al. | |
| 2016/0056831 A1* | 2/2016 | Park ........................ | H03M 1/38 341/172 |
| 2016/0232951 A1* | 8/2016 | Shanbhag ............. | G11C 11/419 |

(Continued)

OTHER PUBLICATIONS

Valavi, Hossein, et al. "A 64-tile 2.4-Mb in-memory-computing CNN accelerator employing charge-domain compute." IEEE Journal of Solid-State Circuits 54.6 (2019): 1789-1799. (Year: 2019).*

(Continued)

*Primary Examiner* — Michael J Huntley
*Assistant Examiner* — Sehwan Kim
(74) *Attorney, Agent, or Firm* — Tutunjian & Bitetto, P.C.; Robert Richard Aragona

(57) ABSTRACT

Mixed signal multipliers and methods for operating the same include a sampling capacitor and an accumulate capacitor. A sampling switch is configured to store an analog value on the sampling capacitor when a digital bit value of a digital signal is one and to store a zero when the digital bit value of the digital signal is a zero. An accumulate switch is configured to store an average of the stored value of the sampling capacitor and a previous stored value of the accumulate capacitor. A processor is configured to alternately trigger the sampling capacitor and the sampling capacitor for each bit value in the digital signal.

18 Claims, 5 Drawing Sheets

(56) References Cited

U.S. PATENT DOCUMENTS

| | | | |
|---|---|---|---|
| 2019/0080231 A1 | 3/2019 | Nestler et al. | |
| 2022/0222516 A1* | 7/2022 | Puchinger | G06N 3/04 |

OTHER PUBLICATIONS

Bui, Trong Tu, and Tadashi Shibata. "Compact bell-shaped analog matching-cell module for digital-memory-based associative processors." Japanese journal of applied physics 47.4S (2008): 2788. (Year: 2008).*

Izeboudjen, Nouma, C. Larbes, and Ahcene Farah. "A new classification approach for neural networks hardware: from standards chips to embedded systems on chip." Artificial Intelligence Review 41 (2014): 491-534. (Year: 2014).*

Youssefi, Bahar, Mitra Mirhassani, and Jonathan Wu. "Efficient mixed-signal synapse multipliers for multi-layer feed-forward neural networks." 2016 IEEE 59th International Midwest Symposium on Circuits and Systems (MWSCAS). IEEE, 2016. (Year: 2016).*

Mirhassani, Mitra, Majid Ahmadi, and William C. Miller. "A feed-forward time-multiplexed neural network with mixed-signal neuron-synapse arrays." Microelectronic engineering 84.2 (2007): 300-307. (Year: 2007).*

Inerfield, M. et al., "An 11.5-ENOB 100-MS/s 8mW Dual-Reference SAR ADC in 28nm CMOS" IEEE 2014 Symposium on VLSI Circuits Digest of Technical Papers (Jun. 2014) pp. 1-2.

Bankman, D. et al., "Passive charge redistribution digital-to-analogue multiplier" Electronic Letters (Mar. 2015) pp. 386-388, vol. 51, No. 5.

Horowitz, M., "Computing's Energy Problem (and what we can do about it)" 2014 IEEE International Solid-State Circuits Conference (Feb. 2014) pp. 10-14.

El Gamal, A. et al., "CMOS Image Sensors: An antroductions to the technology, design, and performace limits, presenting recent developments and future directions" IEEE Circuits & Devices Magazine (May/Jun. 2005) pp. 6-20.

Verma, N. et al., "A Micro-power EEG Acquisition SoC with Integrated Seizure Detection Processor for Continuous Patient Monitoring" 2009 Symposium on VLSI Circuits Digest of Technical Papers (Jun. 2009) pp. 62-63.

Choi, J. et al., "An Energy/Illumination-Adaptive CMOS Image Sensor With Reconfigurable Modes of Operations" IEEE Journal of Solid-State Circuits (Jun. 2015) pp. 1438-1450, vol. 50, No. 6.

Delagnes, E. et al., "A Low Power Multi-Channel Single Ramp ADC with up to 3.2 GHz Virtual Clock" 2006 IEEE Nuclear Science Symposium Conference Record (Oct. 2006) pp. 231-238.

Bankman, D et al., "An 8-bit, 16 input, 3.2 pJ/op Switched-Capacitor Dot Product Circuit in 28-nm FDSOI CMOS" IEEE Asian Solid-State Circuits Conference (Nov. 2016) pp. 21-24.

Kang, M. et al., "A Multi-Functional In-Memory Inference Processor Using a Standard 6T SRAM Array" IEEE Journal of Solid-State Circuits (Feb. 2018) pp. 642-655, vol. 53, No. 2.

Li, Y. et al., "Capacitor-based Cross-point Array for Analog Neural Network with Record Symmetry and Linearity" 2018 Symposium on VLSI Technology Digest of Technical Papers (Jun. 2018) pp. 25-26.

Kang, M. et al., "An In-Memory VLSI Architecture for Convolutional Neural Networks" IEEE Journal on Emerging and Selected Topics in Circuits and Systems (Sep. 2018) pp. 494-505, vol. 8, No. 3.

* cited by examiner

DUAL CAPACITOR MIXED SIGNAL MUTIPLIER

BACKGROUND

The present invention generally relates to mixed analog/digital signal multiplication and, more particularly, to the multiplication of an analog signal and a digital signal using a simple, capacitor-based architecture.

Sensor-rich platforms, such as internet of things devices, health care systems, and autonomous vehicle operations often make use of local decision-making, implemented by machine learning systems. However, many machine learning systems accept sampled data in the analog domain and then convert the sampled data to the digital domain. Other systems, such as in-memory computing and neuromorphic computing often generate intermediate results in the analog domain. The analog-to-digital converters that are employed for this purpose use significant electrical power. Such systems may rely on battery power, making power conservation a priority.

SUMMARY

A mixed signal multiplier includes a sampling capacitor and an accumulate capacitor. A sampling switch is configured to store an analog value on the sampling capacitor when a digital bit value of a digital signal is one and to store a zero when the digital bit value of the digital signal is a zero. An accumulate switch is configured to store an average of the stored value of the sampling capacitor and a previous stored value of the accumulate capacitor. A processor is configured to alternately trigger the sampling capacitor and the sampling capacitor for each bit value in the digital signal.

A method for mixed signal multiplication includes sampling an analog signal to store an analog value on a sampling capacitor, responsive to a bit value of a digital signal. The stored value on the sampling capacitor is averaged with a stored value on an accumulate capacitor to store an averaged value on the accumulate capacitor. The sampling and the averaging are repeated for each bit value of the digital signal.

A neural network processing system includes neuron layers, formed from neurons that each output respective analog values. At least one weight array is between respective neuron layers of the plurality of neuron layers, Weights in the at least one weight array are stored as digital values. A hardware mixed signal multiplier is configured to multiply the analog output values of neurons by the digital values of the weights and to output an analog product.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide mixed-signal processing, particularly multiplication between analog signals and digital signals. By keeping certain signals analog, rather than converting those signals to the digital domain and incurring a substantial power cost from analog-to-digital converters, the present embodiments provide efficiency improvements to hardware-based computing systems. Thus, an analog signal can be maintained throughout the entire computation, providing low-power processing.

Figure 1:
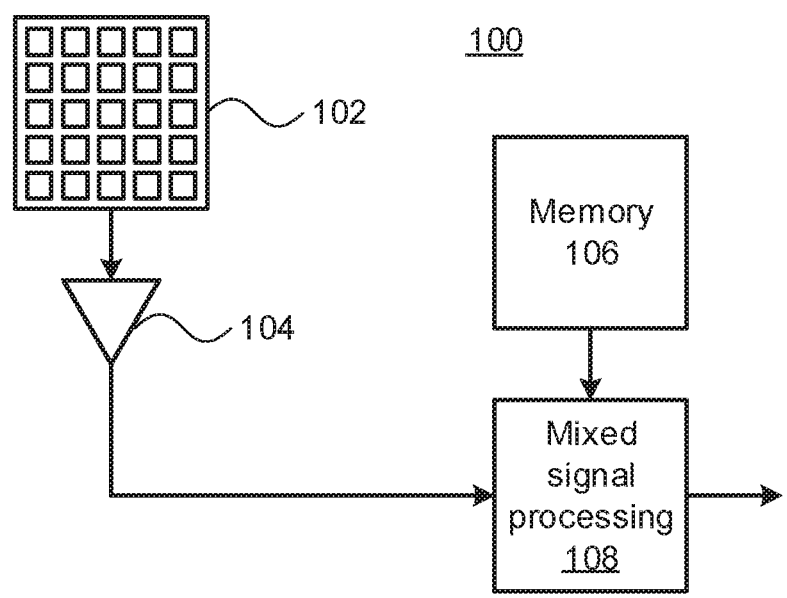
FIG. 1 is a block diagram of a system that uses mixed signal processing to multiply analog values and digital weight values in the analog domain in accordance with an embodiment of the present invention.

Referring now to the drawings in which like numerals represent the same or similar elements and initially to FIG. 1, a mixed-signal processing system 100 is shown. A sensor grid 102 is shown that produces an analog sensor signal, which is then amplified to usable levels by amplifier 104. Although sensor-based inputs are shown, it should be understood that the analog signal can come from any source, such as a prior neuron layer in an artificial neural network (ANN). A memory 106 stores digital values, for example the weight values of an ANN, and provides an appropriate digital signal to mixed signal processing block 108.

Mixed signal processing block 108 performs an appropriate computation using the analog signal and the digital signal, for example performing a multiplication of analog sensor signal by the stored digital weight value. The output of the mixed signal processing 108 is an analog value.

As will be described in greater detail below, this mixed-signal operation can be used for hardware-based computations. Although analog processing can suffer from non-idealities in the low-power regime, many machine learning systems are robust against signal noise, making low-power, mixed-signal computing suitable for such systems in particular.

Figure 2:
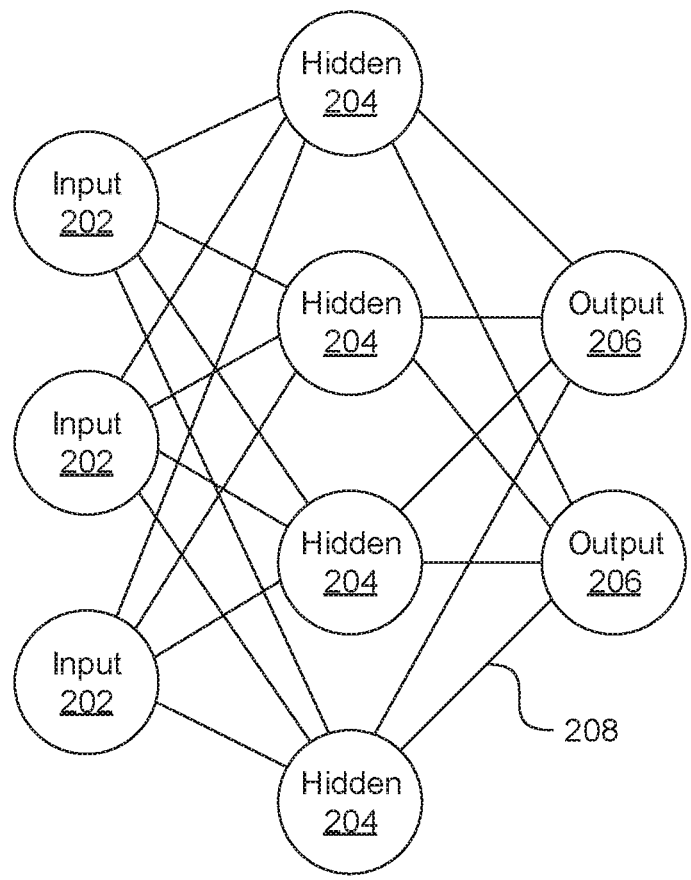
FIG. 2 is a diagram of an exemplary artificial neural network (ANN) that can use mixed signal processing to implement the weights between neurons in accordance with an embodiment of the present invention.

Referring now to FIG. 2, an exemplary ANN is shown, for example using mixed-signal processing to perform computations. An ANN is an information processing system that is inspired by biological nervous systems, such as the brain. The key element of ANNs is the structure of the information processing system, which includes a large number of highly interconnected processing elements (called "neurons") working in parallel to solve specific problems. ANNs are furthermore trained in-use, with learning that involves adjustments to weights that exist between the neurons. An ANN is configured for a specific application, such as pattern recognition or data classification, through such a learning process.

ANNs demonstrate an ability to derive meaning from complicated or imprecise data and can be used to extract patterns and detect trends that are too complex to be detected by humans or other computer-based systems. The structure of a neural network is known generally to have input neurons 202 that provide information to one or more "hidden" neurons 204. Connections 208 between the input neurons 202 and hidden neurons 204 are weighted, and these weighted inputs are then processed by the hidden neurons 204 according to some function in the hidden neurons 204, with weighted connections 208 between the layers. In the present embodiments, the weighted connections 208 can be implemented as a mixed-signal processing system, where the analog signal from a previous neuron layer is multiplied by a digital weight value. Finally, a set of output neurons 206 accepts and processes weighted input from the last set of hidden neurons 204.

This represents a "feed-forward" computation, where information propagates from input neurons 202 to the output neurons 206. Upon completion of a feed-forward computation, the output is compared to a desired output available from training data. The error relative to the training data is then processed in "feed-back" computation, where the hidden neurons 204 and input neurons 202 receive information regarding the error propagating backward from the output neurons 206. The backpropagating signal can similarly be processed by the mixed-signal processing described herein. Once the backward error propagation has been completed, weight updates are performed, with the weighted connections 208 being updated to account for the received error.

This represents just one variety of ANN. There can be any number of layers of hidden neurons 204, as well as neurons that perform different functions. There exist different neural network structures as well, such as convolutional neural network, maxout network, etc. An ANN can be constructed from a variety of different types of neuron layers, including convolutional layers, pooling layers, fully connected layers, softmax layers, or any other appropriate type of neural network layer. Furthermore, layers can be added or removed as needed, and the connections 208 between particular neurons in respective layers can be omitted, for more complicated forms of interconnection.

Figure 3:
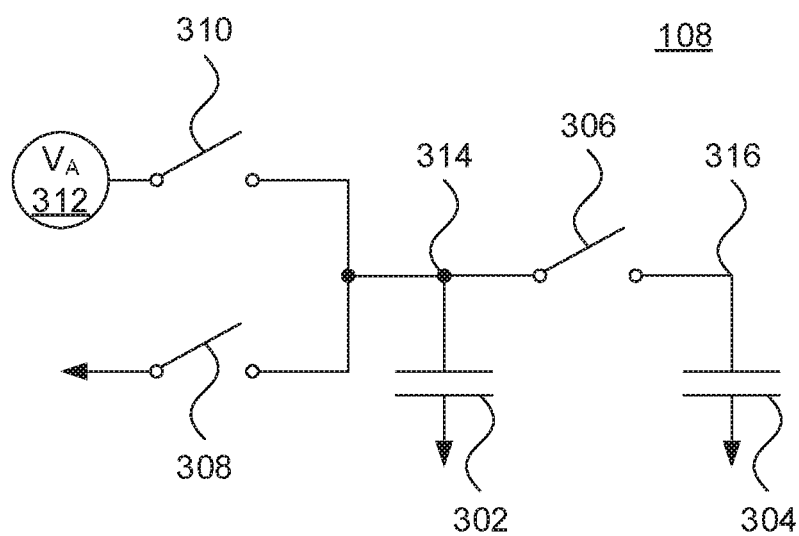
FIG. 3 is a schematic diagram of a mixed signal multiplier that uses two capacitors in alternating sample and accumulate phases to perform multiplication between an analog value and a digital value in accordance with an embodiment of the present invention.

Referring now to FIG. 3, additional detail is shown for the mixed signal processing block 108 is shown. A first capacitor 302 and a second capacitor 304 are used to sample and accumulate signals from analog input 312, which provides an analog voltage. It is specifically contemplated that the first capacitor 302 and the second capacitor 304 have the same capacitance, but it should be understood that some embodiments may have different capacitance values. A set of switches 306, 308, and 310 control the operation of the mixed-signal processing 108. Two voltage nodes 314 and 316 are identified to describe the bit-wise progress of the multiplication.

In a reset phase, the first switch 306 and the second switch 308 are engaged. This connects the capacitors 302 and 304 to ground, emptying any charge that had been stored thereon. The reset phase is used between computations to reset the mixed signal processing block 108.

In an nth sample phase, first switch 306 is turned off, while the second switch 308 and the third switch 310 are controlled by the nth bit value of the digital signal input. The logical value of the nth bit value ($b_n$) controls the third switch 310, while the negation of the logical value of the nth bit ($\overline{b_n}$) controls the second switch 308. For example, if the digital signal input from the memory 106 is the binary value "10," then the first sample phase, which samples "0" starting as the least significant bit, will not engage the third switch 310 and will engage the second switch 308, and the second sample phase, which samples "1" as the next bit, will engage the third switch 310 and will not engage the second switch 308. When the third switch 310 is engaged and the second switch 308 is not engaged, the analog voltage 312 is connected to the first capacitor 302, storing a charge thereon. When the second switch 308 is engaged and third switch 310 is not engaged, the first capacitor 302 is connected to ground, removing any stored charge. Thus, the stored value on the first capacitor 302 during the nth sample phase is the value of the analog signal 312 times the nth bit value of the digital signal.

Said another way, if the binary number "10," the first sample phase will multiply the sample by zero. The earlier a value is sampled, the less of a contribution it has to the final value, because its sample will be halved in each accumulation phase. In this case, the zero this is the least significant bit of the binary value, and so it is used first. The second sample phase in this example will multiply the sample by one. The one is more significant and has a larger contribution to the final total.

In an $n^{th}$ accumulate phase, the first switch 306 is turned on and the second switch 308 and the third switch 310 are turned off. The charges stored on the first capacitor 302 and the second capacitor 304 balance one another. Thus, each accumulate phase averages the stored value on the second capacitor 304 with the latest sampled value on the first capacitor 302.

This process repeats until every bit of the digital signal value has been used. Thus, for an eight-bit digital signal value, there will be eight sample phases and eight accumulate phases. Each successive accumulate phase diminishes the contribution of the previously stored value by half, thereby capturing the significance of the respective bit values. For example, the first bit has half of the significance of the second bit, one quarter the significance as the third bit, and so on.

Table 1 identifies the values of the voltage nodes 314 and 316 during the different phases of a four-bit multiplication, with the different bit values being identified as $b_n$ and with the analog value 312 being identified as $V_A$. Following this example, the final stored value after the last accumulate stage is proportional to the value $V_A B$, where B is the decimal value that is represented by the four binary values $\{b_3, b_2, b_1, b_0\}$. The result can be expressed as $(0.5)^{-4}(8*b_3 + 4*b_2 + 2*b_1 + b_0) \propto V_A B$, where the sample value is effectively multiplied by a normalized version of B.

TABLE 1

| Phase | Switch 306 | Switch 308 | Switch 310 | Voltage 314 | Voltage 316 |
| --- | --- | --- | --- | --- | --- |
| Reset | 1 | 0 | 0 | 0 | 0 |
| Sample 0 | 0 | $\overline{b_0}$ | $b_0$ | $b_0 V_A$ | 0 |
| Accumulate 0 | 1 | 0 | 0 | $0.5 b_0 V_A$ | $0.5 b_0 V_A$ |
| Sample 1 | 0 | $\overline{b_1}$ | $b_1$ | $b_1 V_A$ | $0.5 b_0 V_A$ |
| Accumulate 1 | 1 | 0 | 0 | $0.5 b_1 V_A +$ $(0.5)^2 b_0 V_A$ | $0.5 b_1 V_A +$ $(0.5)^2 b_0 V_A$ |
| Sample 2 | 0 | $\overline{b_2}$ | $b_2$ | $b_2 V_A$ | $0.5 b_1 V_A +$ $(0.5)^2 b_0 V_A$ |
| Accumulate 2 | 1 | 0 | 0 | $0.5 b_2 V_A +$ $(0.5)^2 b_1 V_A +$ $(0.5)^3 b_0 V_A$ | $0.5 b_2 V_A +$ $(0.5)^2 b_1 V_A +$ $(0.5)^3 b_0 V_A$ |

TABLE 1-continued

| Phase | Switch 306 | Switch 308 | Switch 310 | Voltage 314 | Voltage 316 |
|---|---|---|---|---|---|
| Sample 3 | 0 | $\overline{b_3}$ | $b_3$ | $b_3 V_A$ | $0.5 b_2 V_A +$ $(0.5)^2 b_1 V_A +$ $(0.5)^3 b_0 V_A$ |
| Accumulate 3 | 1 | 0 | 0 | $0.5 b_3 V_A +$ $(0.5)^2 b_2 V_A +$ $(0.5)^3 b_1 V_A +$ $(0.5)^4 b_0 V_A$ | $0.5 b_3 V_A +$ $(0.5)^2 b_2 V_A +$ $(0.5)^3 b_1 V_A +$ $(0.5)^4 b_0 V_A$ |

It should be noted that the present embodiments can be contrasted to switched capacitor multipliers, which generally need to have N linearly weighted capacitors, for example with capacitances of c, 2c, 4c, 8c, etc., to represent the N bit positions of a digital value. Because the size of a plate capacitor is roughly proportional to its capacitance (e.g., $\varepsilon A/d$, where A is the area and d is the distance between the plates), the amount of chip are consumed by such a multiplier can be very large when compared to the present embodiments. Furthermore, although the bit precision needs can differ between neuron layers, such a switched capacitor multiplier would need to be able to accommodate the largest amount of precision needed. In contrast, the present embodiments need only two capacitors of a single capacitance value, regardless of the bit precision needed. The present embodiments can therefore take up about $1/128^{th}$ of the surface area of a switched capacitor multiplier for eight bits of precision and uses similarly less power to charge the capacitors.

When contrasted to systems that convert the analog signals to digital signals before multiplication, for example using analog-to-digital converters, similar area benefits can be achieved. In addition, in some embodiments, the present embodiments perform multiplication about 7-8× faster and with about 20× less energy consumed.

Figure 4:
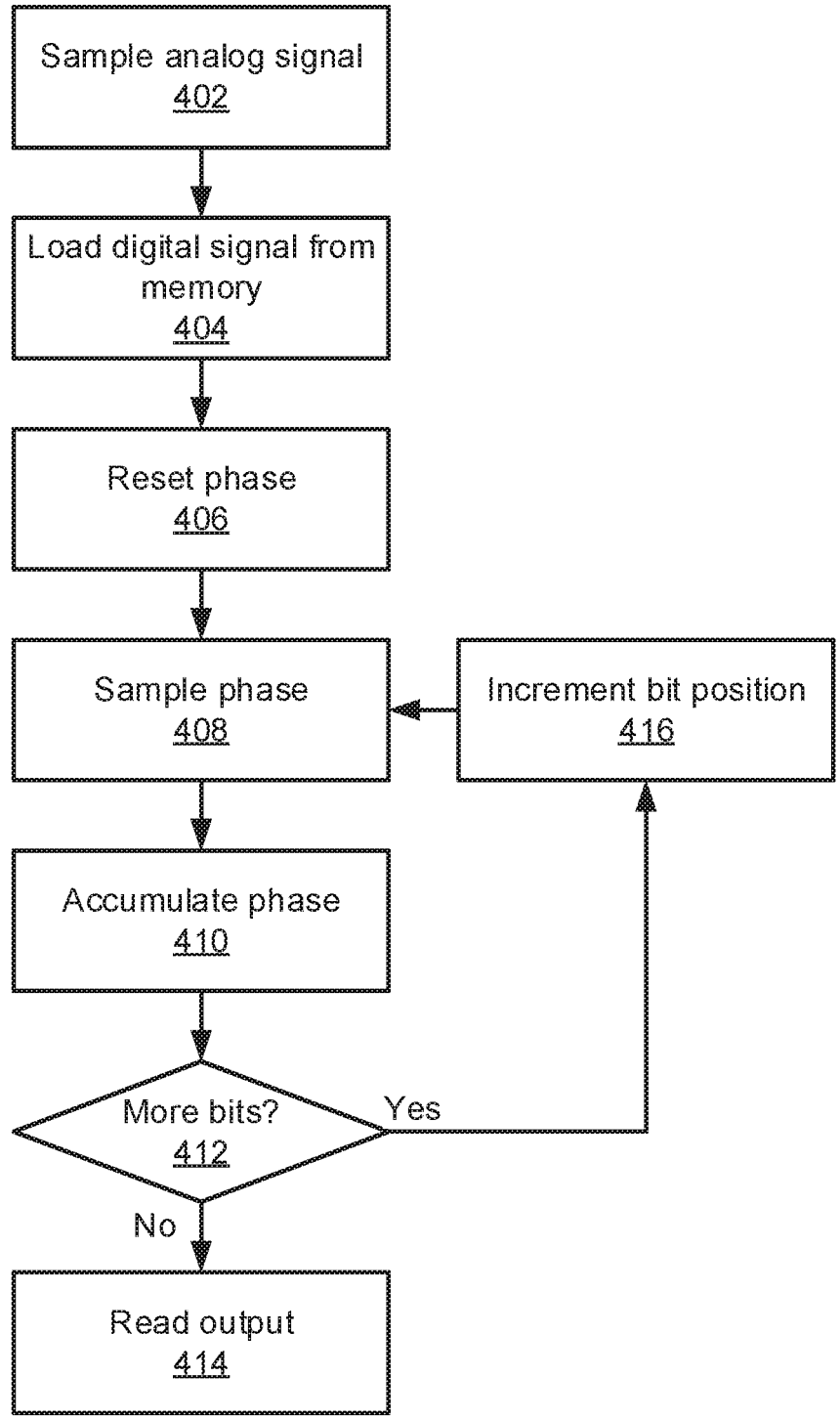
FIG. 4 is a block/flow diagram of a method of performing a mixed signal multiplication that multiplies an analog value by a digital value in accordance with an embodiment of the present invention.

Referring now to FIG. 4, a method for performing a mixed-signal calculation is shown. Block 402 samples an analog signal. In some embodiments, this can draw sensor readings from a sensor grid 102 and/or a sensor amplifier 104. In other embodiments, this can receive an analog signal from a previous layer of a neural network. The analog signal can be represented as a voltage value 312. Block 404 loads a digital signal from memory 106, for example representing a weight value for a respective connection 208 in an ANN.

Block 406 resets the state of the mixed-signal processing block 108, connecting the capacitors 302 and 304 to ground. Block 408 then performs the first sample phase, with a bit number of zero, to sample the value of the analog signal. Block 410 performs the first accumulate phase, averaging the voltage values stored at the first capacitor 302 and the second capacitor 304 by balancing the charges between the two capacitors.

If block 412 determines that there are more bits in the digital signal value, block 416 increments the bit position and processing returns to the sample phase, with the new bit number. If there are no more bits remaining in the digital signal value, block 414 reads the output from either the first voltage node 314 or the second voltage node 316, as the two voltages will be equal with the third switch 310 being engaged.

Although the present embodiments are specifically described with respect to the use of capacitors to store values during the sample phase and the accumulation phase, it is also contemplated that other storage devices can be used instead. In particular, the sample phase 406 selectively stores the sample in a first storage device (e.g., the first capacitor) based on a bit value, while the accumulate phase 410 averages the fresh value in the first storage device with an accumulated stored value in a second storage device (e.g., the second capacitor).

The present embodiments apply a multiplication by a value between zero and one. No matter what the digital value may be, the mixed signal processing block 108 cannot provide an output analog value that is larger in magnitude than the input analog value. While this is appropriate for ANN embodiments, other systems may make use of a scale factor, for example implemented as an amplifier, that multiplies the amplitude of the output by a fixed or variable factor. In some embodiments, this scale factor can depend on the precision of the digital signal. For example, if a four-bit digital signal is used, the scale factor can be 8, to bring the normalized effective digital value back to its full decimal value. This scaling can be performed when the output is read out in block 414 or in the amplifier 104, before the analog input signal reaches the mixed signal processing block 108.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As employed herein, the term "hardware processor subsystem" or "hardware processor" can refer to a processor, memory, software or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs.

These and other variations of a hardware processor subsystem are also contemplated in accordance with embodiments of the present invention.

Figure 5:
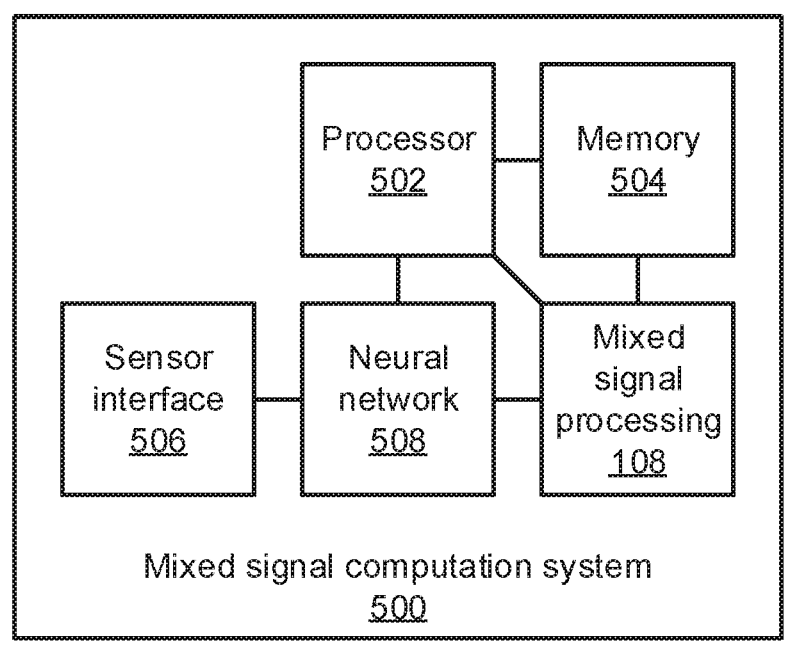
FIG. 5 is a block diagram of a mixed signal computation system that uses mixed signal processing to multiply analog values and digital weight values in the analog domain in accordance with an embodiment of the present invention.

Referring now to FIG. 5, a mixed signal computation system 500 is shown that includes a hardware processor 502 and a memory 504. A sensor interface 506 accepts analog sensor inputs from a sensor 102 that may, in some embodiments, be a separate piece of hardware or that may, in other embodiments, be integrated with the mixed signal computation system.

A neural network 508 is implemented using mixed signal processing 108 for its weights 208. The memory 504 stores digital values for the weights 208 of the neural network 508, and mixed signal processing 108 provides an analog output that multiplies the digital weight value and an analog signal from a previous layer of neurons in the neural network 508.

Figure 6:
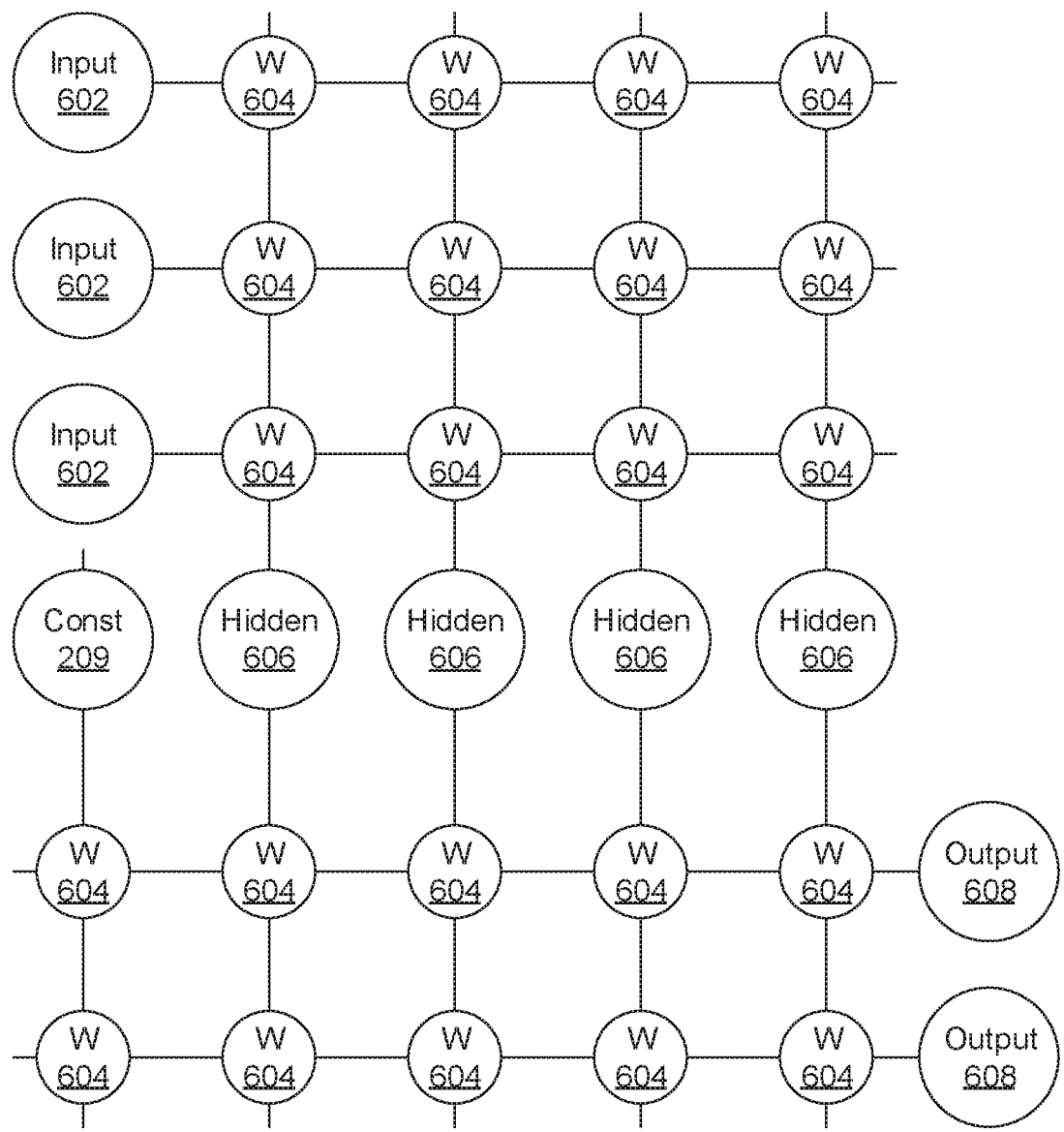
FIG. 6 is a diagram of an exemplary ANN that shows additional detail regarding the implementation of synapses and weight values in accordance with an embodiment of the present invention.

Referring now to FIG. 6, additional detail on the structure of a neural network architecture 600 is shown. It should be understood that the present architecture is purely exemplary, and that other architectures or types of neural network may be used instead. The ANN embodiment described herein is included with the intent of illustrating general principles of neural network computation at a high level of generality and should not be construed as limiting in any way. Furthermore, the layers of neurons described below and the weights connecting them are described in a general manner and can be replaced by any type of neural network layers with any appropriate degree or type of interconnectivity.

During feed-forward operation, a set of input neurons 602 each provide an input signal in parallel to a respective row of weights 604. The weights 604 each have a respective settable value, such that a weight output passes from the weight 604 to a respective hidden neuron 606 to represent the weighted input to the hidden neuron 606. In software embodiments, the weights 604 may simply be represented as coefficient values that are multiplied against the relevant signals, for example using mixed signal processing 108. The signals from each weight add column-wise and flows to a hidden neuron 606.

The hidden neurons 606 use the signals from the array of weights 604 to perform some calculation. The hidden neurons 606 then output a signal of their own to another array of weights 604. This array performs in the same way, with a column of weights 604 receiving a signal from their respective hidden neuron 606 to produce a weighted signal output that adds row-wise and is provided to the output neuron 608.

It should be understood that any number of these stages may be implemented, by interposing additional layers of arrays and hidden neurons 606. It should also be noted that some neurons may be constant neurons 609, which provide a constant output to the array. The constant neurons 609 can be present among the input neurons 602 and/or hidden neurons 606 and are only used during feed-forward operation.

During back propagation, the output neurons 608 provide a signal back across the array of weights 604. The output layer compares the generated network response to training data and computes an error. The error signal can be made proportional to the error value. In this example, a row of weights 604 receives a signal from a respective output neuron 608 in parallel and produces an output which adds column-wise to provide an input to hidden neurons 606. The hidden neurons 606 combine the weighted feedback signal with a derivative of its feed-forward calculation and stores an error value before outputting a feedback signal to its respective column of weights 604. This back-propagation travels through the entire network 600 until all hidden neurons 606 and the input neurons 602 have stored an error value.

During weight updates, the stored error values are used to update the settable values of the weights 604. In this manner the weights 604 can be trained to adapt the neural network 600 to errors in its processing. It should be noted that the three modes of operation, feed forward, back propagation, and weight update, do not overlap with one another.

Having described preferred embodiments of a dual capacitor mixed signal multiplier (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A mixed signal multiplier, comprising:
a sampling capacitor;
a sampling switch configured to apply an input analog value to the sampling capacitor when a digital bit value of a digital signal is one and to apply a zero when the digital bit value of the digital signal is a zero;
an accumulate capacitor;
an accumulate switch configured to store an average of a stored value of the sampling capacitor and a previous stored value of the accumulate capacitor; and
a processor configured to alternately trigger the sampling capacitor and the accumulate capacitor for each bit value in the digital signal to generate a product of the analog value and the digital signal.

2. The mixed signal multiplier of claim 1, further comprising a reset switch configured to connect the sampling capacitor to ground.

3. The mixed signal multiplier of claim 2, wherein the reset switch is further configured to connect the accumulate capacitor to ground when the accumulate capacitor is also triggered.

4. The mixed signal multiplier of claim 2, wherein the processor is further configured to trigger the reset switch when the sampling switch is activated and the digital bit value of the digital signal is zero.

5. The mixed signal multiplier of claim 1, wherein the analog signal is an output from a neuron in a neural network and the digital signal is a digital weight value in the neural network.

6. The mixed signal multiplier of claim 1, wherein the sampling capacitor and the accumulate capacitor have equal capacitance.

7. The mixed signal multiplier of claim 1, wherein the processor is further configured to read out an output value that is stored on the accumulate capacitor after using all bit values in the digital signal.

8. A method for mixed signal multiplication, comprising:
sampling an analog signal to apply an input analog value to a sampling capacitor, responsive to a bit value of a digital signal;
averaging the stored value on the sampling capacitor with a stored value on an accumulate capacitor to store an averaged value on the accumulate capacitor; and
repeating the sampling and the averaging for each bit value of the digital signal to generate a product of the analog value and the digital signal.

9. The method of claim 8, further comprising outputting the stored averaged value from the accumulate capacitor after every bit value of the digital signal has been used.

10. The method of claim 8, further comprising resetting the stored value on the sampling capacitor and the stored value on the accumulate capacitor to zero before sampling the analog signal a first time.

11. The method of claim 8, wherein sampling the analog signal comprises applying the analog value on the sampling capacitor responsive to a bit value of one and applying a zero value on the sampling capacitor responsive to a bit value of zero.

12. The method of claim 8, further comprising reading out the averaged value stored on the accumulate capacitor as an output value after all bit values of the digital signal have been used.

13. The method of claim 12, wherein reading out the averaged value further comprises multiplying the averaged value by a scale factor that depends on a precision of the digital signal.

14. A neural network processing system, comprising:
a plurality of neuron layers, formed from neurons that each output respective analog values;
at least one weight array, between respective neuron layers of the plurality of neuron layers, with weights in the at least one weight array being stored as digital values; and
a hardware mixed signal multiplier, configured to multiply the analog output values of neurons by the digital values of the weights and to output an analog product of the analog output values and the digital values, that includes:
a sampling capacitor;
an accumulate capacitor;
a sampling switch configured to apply an input analog value to the sampling capacitor when a digital bit value of a digital signal is one and to apply a zero when the digital bit value of the digital signal is a zero; and
an accumulate switch configured to store an average of the stored value of the sampling capacitor and a previous stored value of the accumulate capacitor, wherein the sampling capacitor and the accumulate capacitor are alternately triggered for each bit value in the digital signal to generate the analog product of the analog output values and the digital values.

15. The neural network processing system of claim 14, wherein the mixed signal multiplier is further configured to alternately trigger the sampling capacitor and the sampling capacitor for each bit value in the digital signal.

16. The neural network processing system of claim 14, wherein the mixed signal multiplier further comprises a reset switch configured to connect the sampling capacitor to ground.

17. The neural network processing system of claim 16, wherein the mixed signal multiplier is further configured to trigger the reset switch when the sampling switch is activated, and the digital bit value of the digital signal is zero.

18. The neural network processing system of claim 14, wherein the sampling capacitor and the accumulate capacitor have equal capacitance.

* * * * *